United States Patent
Kim

(10) Patent No.: US 11,681,188 B2
(45) Date of Patent: Jun. 20, 2023

(54) DISPLAY DEVICE HAVING AN IMPROVED ELECTRICAL CONNECTION BETWEEN A PIXEL ELECTRODE AND A SWITCHING ELEMENT AND MANUFACTURING METHOD THEREOF

(71) Applicant: Samsung Display Co., Ltd., Yongin-Si (KR)

(72) Inventor: In Woo Kim, Asan-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 78 days.

(21) Appl. No.: 16/858,529

(22) Filed: Apr. 24, 2020

(65) Prior Publication Data

US 2021/0098498 A1    Apr. 1, 2021

(30) Foreign Application Priority Data

Oct. 1, 2019   (KR) .......................... 10-2019-0121681

(51) Int. Cl.
*G02F 1/1362*   (2006.01)
*H01L 27/12*    (2006.01)
*G02F 1/1343*   (2006.01)
*G02F 1/1333*   (2006.01)

(52) U.S. Cl.
CPC .... *G02F 1/136227* (2013.01); *G02F 1/13439* (2013.01); *G02F 1/133345* (2013.01); *H01L 27/124* (2013.01); *G02F 1/134372* (2021.01); *G02F 1/136295* (2021.01); *G02F 2201/121* (2013.01); *G02F 2201/123* (2013.01)

(58) Field of Classification Search
CPC ..................................................... H01L 27/124
See application file for complete search history.

(56) References Cited

U.S. PATENT DOCUMENTS

| | | | | |
|---|---|---|---|---|
| 8,913,220 | B2 * | 12/2014 | Kim | .................... H01L 27/1248 349/138 |
| 9,104,060 | B2 * | 8/2015 | Lee | .................... G02F 1/133512 |
| 2012/0298984 | A1 * | 11/2012 | Park | .................... H01L 27/1225 438/34 |

FOREIGN PATENT DOCUMENTS

| | | |
|---|---|---|
| EP | 0859970 B1 | 7/2003 |
| EP | 1130455 B1 | 6/2005 |
| KR | 10-0582599 B1 | 5/2006 |
| KR | 10-2007-0052173 A | 5/2007 |

(Continued)

*Primary Examiner* — Paisley L Wilson
(74) *Attorney, Agent, or Firm* — Innovation Counsel LLP

(57) ABSTRACT

An exemplary embodiment of the present inventive concept provides a display device including: a substrate; a metal layer disposed on the substrate; a pixel electrode disposed on the metal layer and including a protrusion overlapping the metal layer; a first insulating layer covering the metal layer and the pixel electrode; an extension of a drain electrode disposed on the first insulating layer and overlapping a portion of the protrusion; a second insulating layer covering the first insulating layer and the extension; and a pixel electrode connector disposed on the second insulating layer and overlapping the protrusion and the extension, wherein the first insulating layer and the second insulating layer include a first opening exposing an upper surface of the protrusion and an upper surface of the extension, and the pixel electrode connector contacts the upper surface of the extension and the upper surface of the protrusion through the first opening.

14 Claims, 12 Drawing Sheets

(56) References Cited

FOREIGN PATENT DOCUMENTS

| KR | 10-2012-0080885 | A | | 7/2012 |
|---|---|---|---|---|
| KR | 10-1897747 | B1 | | 10/2018 |
| KR | 101897747 | B1 | * | 10/2018 |

* cited by examiner

DISPLAY DEVICE HAVING AN IMPROVED ELECTRICAL CONNECTION BETWEEN A PIXEL ELECTRODE AND A SWITCHING ELEMENT AND MANUFACTURING METHOD THEREOF

CROSS-REFERENCE TO RELATED APPLICATION

This application claims priority to and benefits of Korean Patent Application No. 10-2019-0121681 filed in the Korean Intellectual Property Office on Oct. 1, 2019, the entire contents of which are incorporated herein by reference.

BACKGROUND (a) Field

The present disclosure relates to a display device and a manufacturing method thereof.

(b) Description of the Related Art

As a display device, a liquid crystal display (LCD), an organic light emitting diode display (OLED), and the like are used.

The display device includes pixels for displaying an image, and each pixel includes a pixel electrode to which a data signal for displaying predetermined luminance is applied. The pixel electrode may be electrically connected to a data line for transferring a data signal by a switching element such as a transistor. The pixel electrode and the switching element may be connected with each other by forming an opening in an insulating layer disposed therebetween and allowing the pixel electrode or a conductor that is electrically connected to the pixel electrode to be in contact with the switching element through the opening.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments have been made in an effort to improve an electrical connection characteristic between a pixel electrode and a switching element.

An exemplary embodiment of the present inventive concept provides a display device including: a substrate; a metal layer disposed on the substrate; a pixel electrode disposed on the substrate and the metal layer and including a protrusion overlapping the metal layer; a first insulating layer covering the metal layer and the pixel electrode; an extension of a drain electrode disposed on the first insulating layer and overlapping a portion of the protrusion; a second insulating layer covering the first insulating layer and the extension; and a pixel electrode connector disposed on the second insulating layer and overlapping the protrusion and the extension, wherein the first insulating layer and the second insulating layer include a first opening exposing an upper surface of the protrusion and an upper surface of the extension, and the pixel electrode connector contacts the upper surface of the protrusion and the upper surface of the extension through the first opening.

The first opening may include a first region overlapping the protrusion and the extension, and a second region overlapping the protrusion and not overlapping the extension.

The first insulating layer disposed under the extension has an undercut portion.

The metal layer may include a region where the first opening is defined.

The pixel electrode connector may include a disconnected portion within the first opening.

The display device may further include a gate line disposed between the substrate and the first insulating layer, and the metal layer may be formed of a same material and formed at a same time as the gate line.

The metal layer may not be connected to the gate line.

The pixel electrode connector may include a transparent conductive material.

The display device may further include: a common voltage line disposed on the substrate; and a common electrode disposed on the common voltage line, the first insulating layer and the second insulating layer disposed between the common voltage line and the common electrode may include a second opening exposing an upper surface of the common voltage line, and the common electrode may contact the upper surface of the common voltage line through the second opening.

The pixel electrode connector may be not connected to the common electrode and formed of a same material and formed at a same time as the common electrode.

The pixel electrode may overlap the common electrode with the first insulating layer and the second insulating layer interposed therebetween.

The pixel electrode disposed in each pixel may have a plate shape, and the common electrode may have a shape including a slit.

The display device may further include an upper substrate opposing the substrate and a liquid crystal layer disposed between the substrate and the upper substrate.

The second insulating layer may include a first layer including an inorganic insulating material, and a second layer disposed on the first layer and including an organic insulating material.

An exemplary embodiment of the present inventive concept provides a manufacturing method of a display device, including: forming a gate conductor including a gate line, a common voltage line, and a metal layer on a substrate; forming a pixel electrode including a protrusion overlapping the metal layer on the substrate; forming a first insulating layer to cover the gate conductor and the pixel electrode; forming a data conductor including an extension of a drain electrode on the first insulating layer; forming a second insulating layer to cover the first insulating layer and the data conductor; forming a first opening through which an upper surface of the protrusion and an upper surface of the extension are exposed by removing the first insulating layer and the second insulating layer; and forming a pixel electrode connector on the second insulating layer, the pixel electrode connector contacting the upper surface of the protrusion and the upper surface of the extension.

In the removing of the first insulating layer and the second insulating layer, an undercut in the first insulating layer disposed under of the extension may be formed.

The pixel electrode connector may include a disconnected portion within the first opening.

The removing of the first insulating layer and the second insulating layer may be performed by using a dry etch process.

The first opening may include a first region overlapping the protrusion and the extension, and a second region overlapping the protrusion and not overlapping the extension.

In the forming of the pixel electrode connector, a common electrode which is disconnected from the pixel electrode connector and formed of a same material as the pixel electrode connector may be formed.

According to the exemplary embodiments, it is possible to improve the electrical connection characteristic between the pixel electrode and the switching element by forming the metal layer at a lower portion of the pixel electrode.

In addition, it is possible to smoothly maintain the flow of current by forming the metal layer at the lower portion of the pixel electrode in spite of damage to the pixel electrode in the dry etching process of forming an opening in the insulating layer between the pixel electrode and the switching element.

DETAILED DESCRIPTION OF THE EMBODIMENTS

Figure 1:
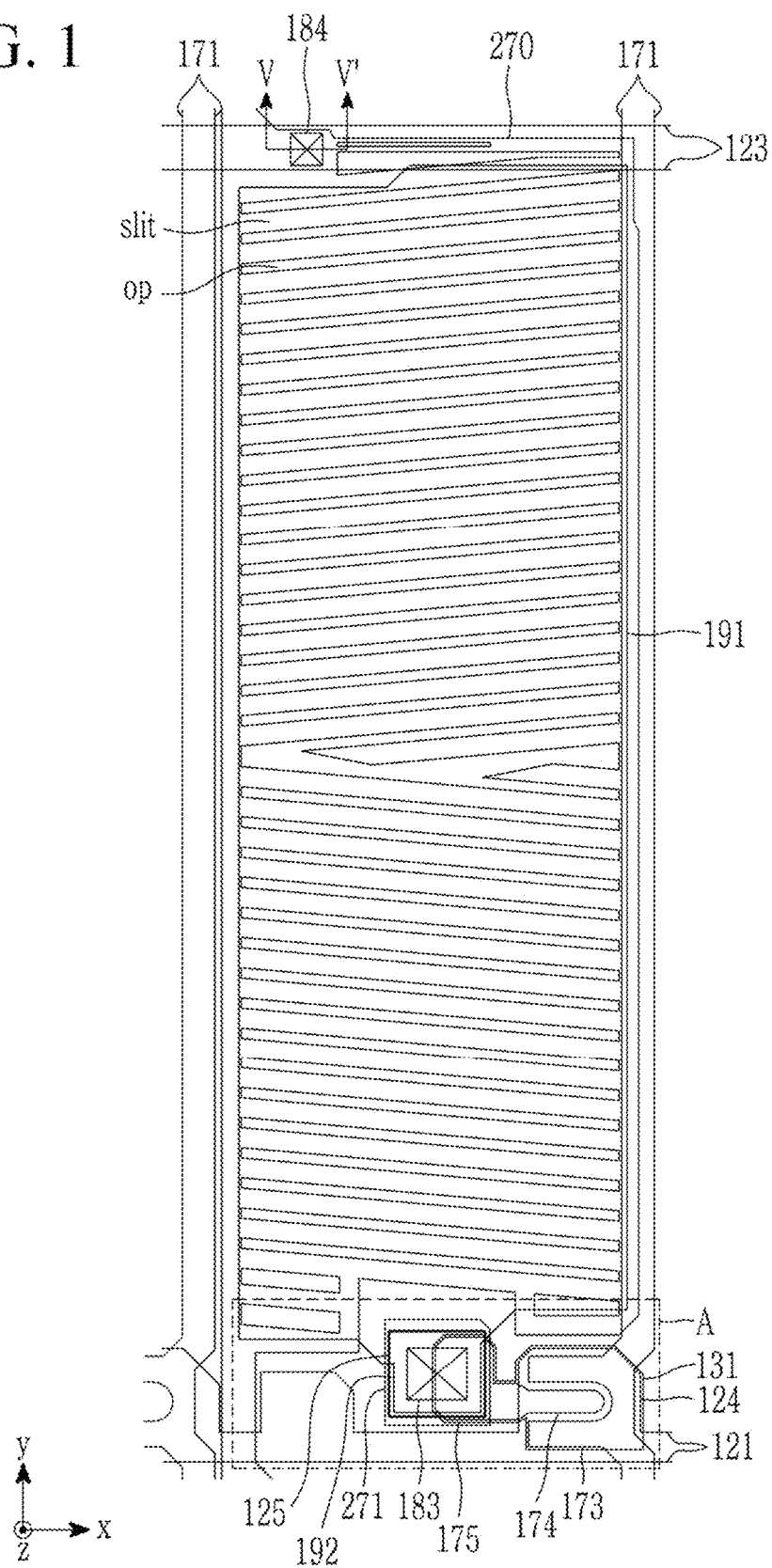
FIG. 1 illustrates a plan view of a pixel of a display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent elements shown in the accompanying drawings are arbitrarily given for better understanding and ease of description, the present inventive concept is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

A display device according to an exemplary embodiment will be described with reference to the accompanying drawings by taking a liquid crystal display as an example. First, it will be described in detail with reference to FIG. 1 to FIG. 5.

Figure 2:
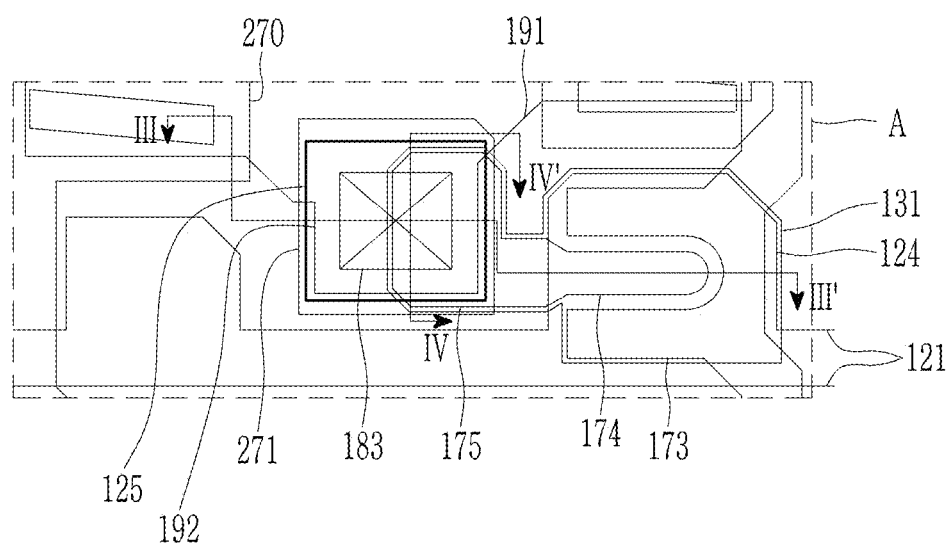
FIG. 2 illustrates an enlarged view of a region in which a transistor and an opening are positioned in FIG. 1.
Figure 3:
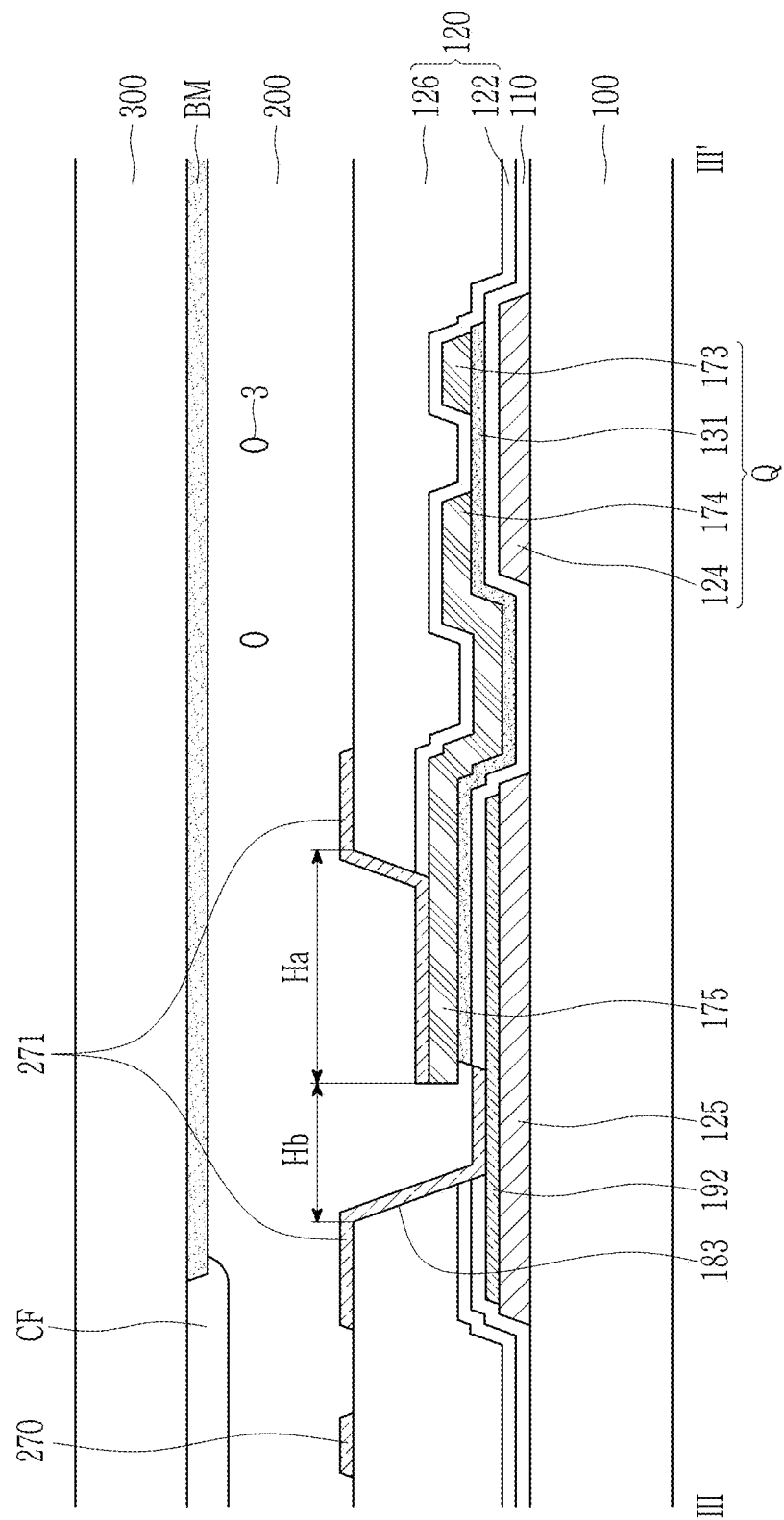
FIG. 3 illustrates a cross-sectional view taken along a line III-III' of FIG. 2.
Figure 4:
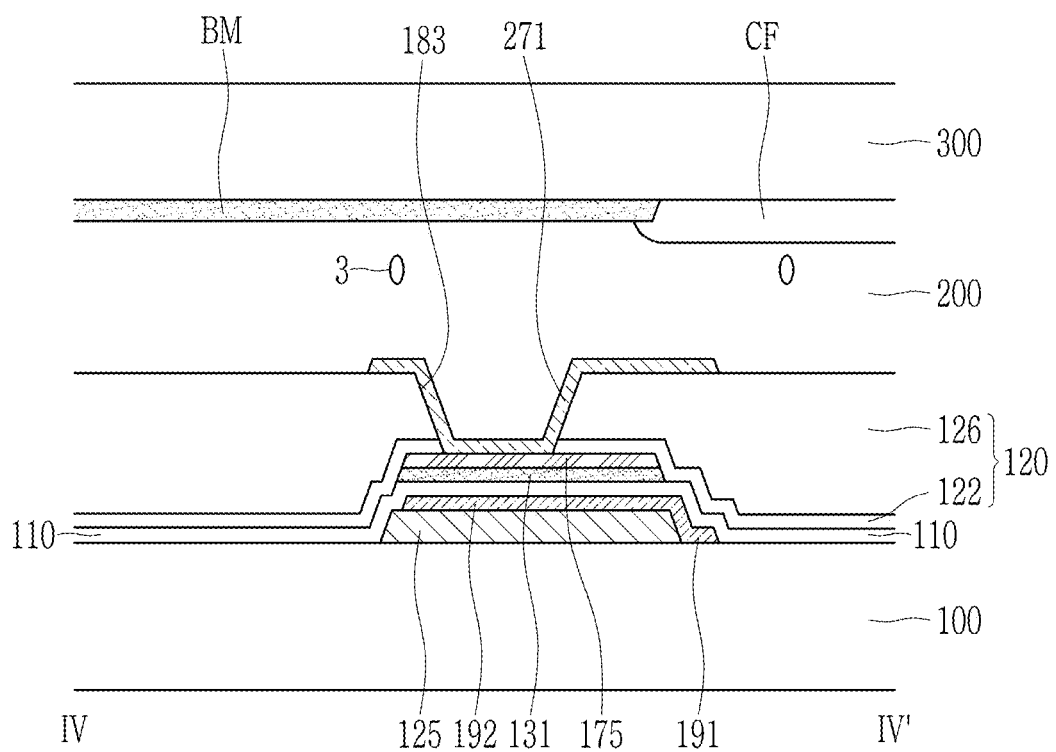
FIG. 4 illustrates a cross-sectional view taken along a line IV-IV' of FIG. 2.
Figure 5:
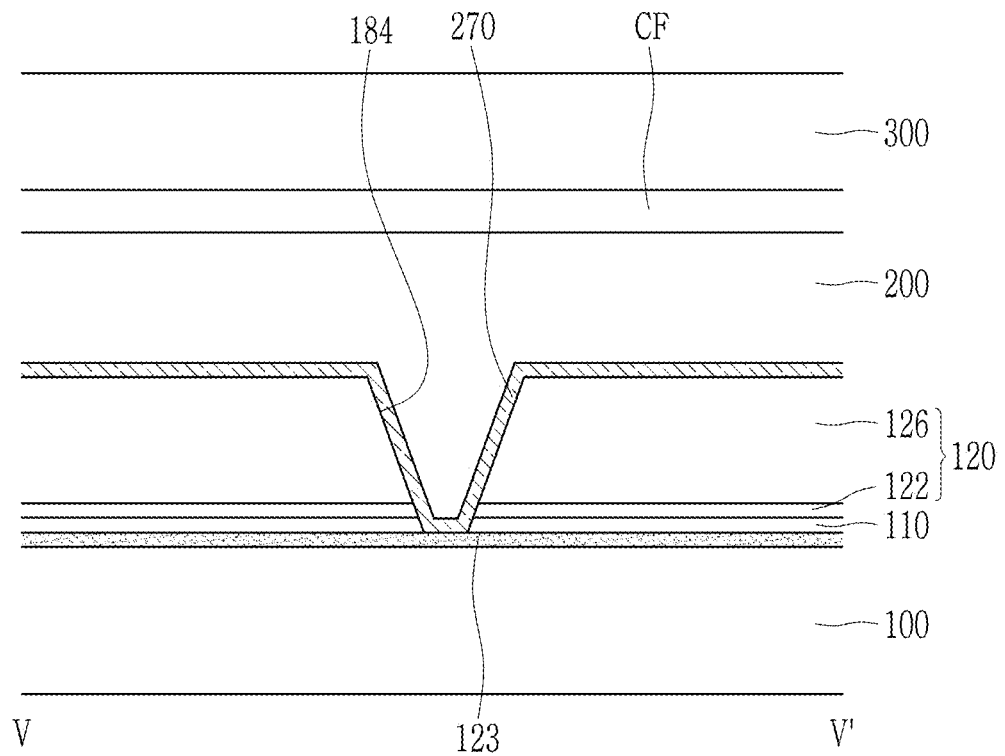
FIG. 5 illustrates a cross-sectional view taken along a line V-V' of FIG. 1.

FIG. 1 illustrates a plan view of a pixel of a display device according to an exemplary embodiment. FIG. 2 illustrates an enlarged view of a region in which a transistor and an opening are positioned in FIG. 1, FIG. 3 illustrates a cross-sectional view taken along a line III-III' of FIG. 2, FIG. 4 illustrates a cross-sectional view taken along a line IV-IV' of FIG. 2, and FIG. 5 illustrates a cross-sectional view taken along a line V-V' of FIG. 1.

Referring to FIG. 1 to FIG. 5, the display panel of the display device according to the present exemplary embodiment includes a first substrate 100 and a second substrate 300 facing each other, and a liquid crystal layer 200 disposed between the first substrate 100 and the second substrate 300. The first substrate 100 may be referred to as a lower substrate, and the second substrate 300 may be referred to as an upper substrate.

A gate conductor including a gate line 121, a common voltage line 123, and a metal layer 125 is disposed on the first substrate 100 which may be made of a transparent insulator such as glass.

The gate line 121 transferring a gate voltage mainly extends in a first direction x. The gate line 121 includes a protrusion 124, and a portion of the protrusion constitutes a gate electrode 124 of a transistor Q. In the present specification, the protrusion 124 indicates a protruding portion in a plan view.

The common voltage line 123 may transfer a constant voltage such as a common voltage. The common voltage line 123 extends mainly in the first direction x.

The metal layer 125 is disposed at a side of the gate line 121, and is spaced apart from the gate line 121 and the gate electrode 124. The metal layer 125 may be a discrete pattern which isolated from the gated line 121 and the gate electrode 124. That is, the metal layer 125 is separated from the gate line 121 as an island shape. The metal layer 125 may be in contact with a pixel electrode connector 271, which will be described later, to be electrically connected to a drain electrode 174.

The gate conductor may include a metal such as molybdenum (Mo), copper (Cu), aluminum (Al), magnesium (Mg), silver (Ag), gold (Au), platinum (Pt), palladium (Pd), nickel (Ni), neodymium (Nd), iridium (Ir), tungsten (W), titanium (Ti), chromium (Cr), or tantalum (Ta). The gate conductor may be a single layer or a multi-layer.

A pixel electrode 191 is disposed on the gate conductor and the metal layer 125. The pixel electrode 191 may have a planar shape, may be formed as a plate shape on each pixel area, and may include a protrusion 192 partially overlapping the metal layer 125 and the pixel electrode connector 271.

The pixel electrode 191 may be spaced apart from the gate line 121. The pixel electrode 191 may be made of a transparent conductive material such as ITO or IZO.

A protrusion 192 of the pixel electrode 191 may be disposed on the metal layer 125. The protrusion 192 may overlap the metal layer 125 in a plan view, and the protrusion 192 may be disposed within an area of the metal layer 125. The protrusion 192 may directly contact the metal layer 125 and the pixel electrode connector 271 which will be described later. The pixel electrode 191 receives a data voltage from the drain electrode 174 of the transistor Q through the pixel electrode connector 271.

A first insulating layer 110 is disposed on the gate conductor and the pixel electrode 191 to cover the gate conductor and the pixel electrode 191. The first insulating layer 110 may include an inorganic insulating material such as a silicon oxide or a silicon nitride, and the first insulating layer 110 may be referred to as a gate insulating layer.

A semiconductor layer 131 may be disposed on the first insulating layer 110. The semiconductor layer 131 may overlap the gate electrode 124 of the transistor Q. The semiconductor layer 131 may include a semiconductor material such as an amorphous silicon, a polycrystalline silicon, or an oxide semiconductor.

The semiconductor layer 131 may be formed to overlap the gate electrode 124, and may be formed to partially overlap the metal layer 125 and the protrusion 192 of the pixel electrode 191.

A data conductor including a data line 171, a source electrode 173 and a drain electrode 174 of the transistor Q is disposed on the semiconductor layer 131.

The data line 171 transferring the data voltage mainly extends in the second direction y, and intersects the gate line 121 and the common voltage line 123. The source electrode 173 is directly connected to the data line 171 and may be a protrusion or a portion of the data line 171.

The drain electrode 174 has a rod-shaped end portion facing the source electrode 173 and another end portion having a large area, that is, an extension 175. The extension 175 is a portion for connecting the pixel electrode 191 to the transistor Q, and partially overlaps the metal layer 125, the pixel electrode connector 271, and the protrusion 192 of the pixel electrode 191 in a plan view.

The gate electrode 124, the source electrode 173, and the drain electrode 174 constitute a transistor Q together with the semiconductor layer 131. In the transistor Q, the source electrode 173 and the drain electrode 174 may face each other with a channel disposed therebetween in a plan view as indicated in the drawing. Accordingly, the extension 175 may be an extension of the drain electrode 174 of the transistor Q.

The channel of the transistor Q may be formed in a portion of the semiconductor layer 131 disposed between the source electrode 173 and the drain electrode 174 in a plan view. An ohmic contact may be provided between the data conductor and the semiconductor layer 131. The semiconductor layer 131 may have a substantially same planar shape as the drain electrode 174, the source electrode 173, and the ohmic contact thereunder.

The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta).

A second insulating layer 120 is disposed on the data conductor. The second insulating layer 120 covers the data conductor and the first insulating layer 110. The second insulating layer 120 may include a plurality of layers, and may include a first layer 122 and a second layer 126. The first layer 122 may include an inorganic insulating material such as a silicon nitride or a silicon oxide. The second 126 may include an organic insulating material. The second 126 may be a color filter, or may include a color filter. In the second insulating layer 120, the first layer 122 may be omitted, and only the second 126 may be disposed, or the second 126 may be omitted, and only the first layer 122 may be disposed.

A common electrode 270 and a pixel electrode connector 271 are disposed on the second insulating layer 120.

The common electrode 270 includes a transparent conductive material such as ITO or IZO, and includes an opening op and a slit extending obliquely in the first direction x. The opening op is formed between the slits, and the slits overlap the planar pixel electrode 191.

The pixel electrode connector 271 includes a transparent conductive material such as ITO or IZO, and is separated from the common electrode 270. The pixel electrode connector 271 may be a discrete pattern and may be formed of the same material as the common electrode 270 through the same process. The pixel electrode connector 271 may be disposed to overlap the metal layer 125, the protrusion 192 of the pixel electrode 191, and the drain electrode 174 of the transistor Q. The metal layer 125 may be disposed to include a region in which a first opening 183, which will be described later, is defined.

Referring to FIG. 3, the pixel electrode connector 271 is connected to the extension 175 of the drain electrode 174 and the protrusion 192 of the pixel electrode 191 through the first opening 183 formed in the first insulating layer 110 and the second insulating layer 120. Accordingly, the pixel electrode 191 may receive a data voltage from the drain electrode 174 of the transistor Q via the pixel electrode connector 271 which connects the extension 175 of the drain electrode 174 and the protrusion 192 of the pixel electrode 191.

The pixel electrode connector 271 is connected to the protrusion 192 of the pixel electrode 191 and the extension 175 of the drain electrode 174 through the first opening 183. That is, the pixel electrode connector 271 is connected to the drain electrode 174 and the pixel electrode 191 through one opening 183.

Since the extension 175 and the protrusion 192 are disposed at different levels, they may be connected in a side contact manner, in which electrical connections between conductors disposed at different layers are performed through one opening 183.

One opening 183 may include a first region Ha in which the extension 175 and the protrusion 192 overlap, and a second region Hb that overlaps the protrusion 192 and does not overlap the extension 175.

Before the pixel electrode connector 271 is formed, the first region Ha exposes an upper surface of the extension 175, and the second region Hb exposes an upper surface of the protrusion 192. Therefore, after the first opening 183 is formed, the pixel electrode connector 271 formed on the second insulating layer 120 may directly contact the upper surface of the extension 175 and the upper surface of the protrusion 192 through the first opening 183.

The pixel electrode connector 271 may be disconnected at a side of the extension 175 due to a step formed by the extension 175, the semiconductor layer 131 and the first insulating layer 110, and under-cut formed in the semiconductor layer 131 and the first insulating layer 110 under the extension 175. The disconnected portion of the pixel electrode connector 271 may substantially correspond to a boundary between the first region Ha and the second region Hb.

However, referring to FIG. 4, since the pixel electrode connector 271 is connected to an upper surface of the expansion 175 to surround the first opening 183, the expansion 175 and the protrusion 192 may be electrically connected to each other.

In addition, since the protrusion 192 overlaps the metal layer 125, the metal layer 125 may be electrically connected to the pixel electrode connector 271 through the protrusion 192. The metal layer 125 may be formed to have a size that is sufficient to include a region in which an opening is formed for stable connection of the protrusion 192.

A data voltage applied from the extension 175 may flow in a current path formed in parallel through the protrusion 192 of the pixel electrode 191 and the metal layer 125 disposed below the protrusion 192. Electrical resistivity of the protrusion 192 made of a transparent conductive material is about $10^3$ Ωm, and electrical resistivity of the metal layer 125 made of a metallic material is about 1 Ωm. When conductors are connected in parallel, total resistance (R=ρ*l/s) is inversely proportional to resistivity. Accordingly, connection resistance of a conductor that performs connection of the pixel electrode 191 generally decreases. That is, since current flows smoothly between the pixel electrode 191 and the expansion 175 of the drain electrode 174, electrical connection characteristics of the pixel electrode 191 and the switching element may be improved.

Referring to FIG. 5, the common electrode 270 is connected to the common voltage line 123 through a second opening 184 to receive a common voltage. The first insulating layer 110 and the second insulating layer 120 disposed on the common voltage line 123 include the second opening 184. The common electrode 270 directly contacts the upper surface of the common voltage line 123 that is exposed through the second opening 184 to be electrically connected to the common voltage line 123.

The common electrode 270 receiving the common voltage may generate an electric field in the liquid crystal layer 200 together with the pixel electrode 191 receiving the data voltage.

A liquid crystal layer 200 including a plurality of liquid crystal molecules 3 is disposed between the first substrate 100 and the second substrate 300. The liquid crystal molecules 3 may be oriented such that their major axes are parallel or perpendicular to surfaces of the two substrates 100 and 300 in the absence of an electric field.

A color filter and a light blocking member BM called a black matrix may be disposed on the second substrate 300, which may be made of a transparent insulator such as glass. The light blocking member BM may define a transmissive region of a pixel, and the color filter CF may be disposed mostly in the transmissive region of the pixel. The color filter CF may display one of primary colors, such as red, green, and blue. Unlike the present exemplary embodiment, at least one of the light blocking member BM and the color filter CF may be disposed on the first substrate 100. An overcoat (not illustrated) may be further disposed on the light blocking member BM and the color filter CF.

A manufacturing method of a display device according to an exemplary embodiment will now be described with reference to FIG. 6 to FIG. 8 together with the drawings described above.

Figure 6:
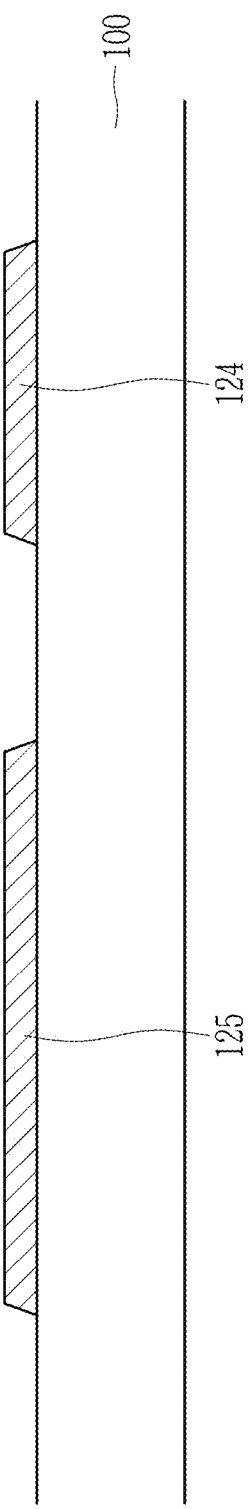
FIG. 6, 7, 8, 9 and FIG. 10 illustrate a manufacturing method of a display device according to an exemplary embodiment.
Figure 7:
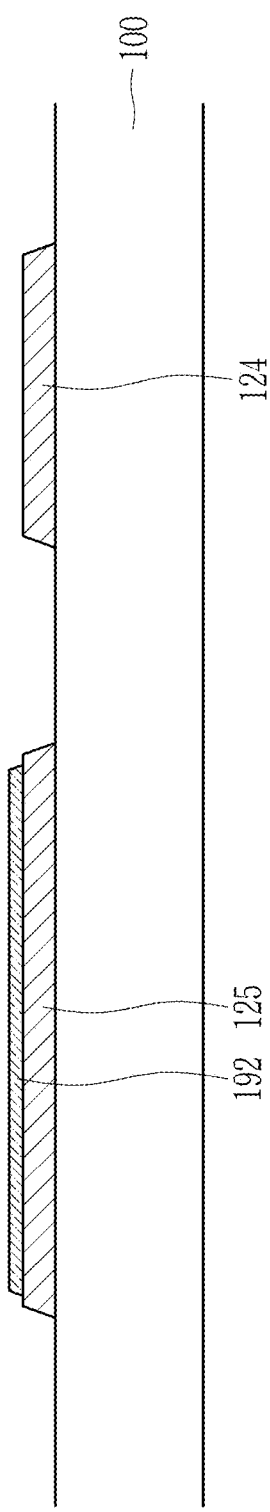
Figure 8:
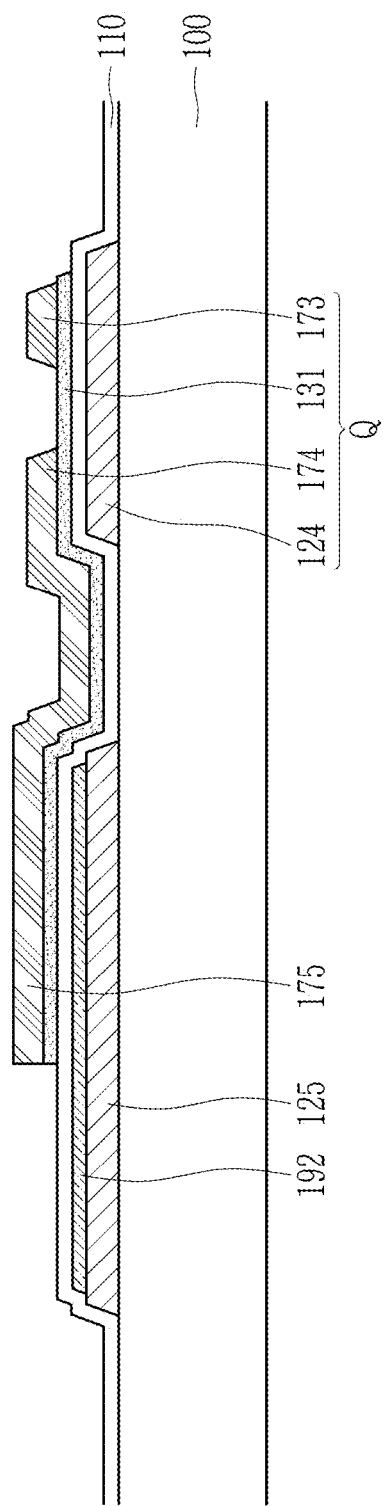

FIG. 6 to FIG. 8 illustrate a manufacturing method of a display device according to an exemplary embodiment.

First, referring to FIG. 6, a gate conductor including a gate line 121, a gate electrode 124, a common voltage line 123, and a metal layer 125 may be formed on the first substrate 100.

The first substrate 100 may include an insulating material such as glass, and the gate conductor may include at least one metal of molybdenum (Mo), copper (Cu), aluminum (Al), magnesium (Mg), silver (Ag), gold (Au), platinum (Pt), palladium (Pd), nickel (Ni), neodymium (Nd), iridium (Ir), tungsten (W), titanium (Ti), chromium (Cr), and tantalum (Ta).

Thereafter, the pixel electrode 191 may be formed directly on the gate conductor or the first substrate 100. Referring to FIG. 7, the protrusion 192 of the pixel electrode 191 is directly formed on the gate conductor. The pixel electrode 191 may be formed by a photolithography process using a mask that is different from that of the gate conductor. The pixel electrode 191 may include a transparent conductive material such as ITO and IZO. An area of the protrusion 192 formed on the metal layer 125 may be smaller than that of the metal layer 125. Accordingly, an outline of the protrusion 192 may be formed in an outline of the metal layer 125.

In an exemplary embodiment, when forming the protrusion 192 on the metal layer 125, nucleation and grain growth of the protrusion 192 are promoted more than when the protrusion 192 is directly disposed the first substrate 100 by a catalytic function of the metal layer 125. When the nucleation and grain growth of the protrusion 192 are promoted, a protrusion 192 having improved conductivity may be formed on the metal layer 125. Therefore, even when damage occurs in the protrusion 192, the connection characteristics of the pixel electrode 191 and the extension 175 may not be deteriorated. An effect of improving the grain growth of the protrusion 192 will be described in detail with reference to FIG. 11.

Referring to FIG. 7 again, after forming the pixel electrode 191 including the protrusion 192 as disclosed in FIG. 7, the first insulating layer 110 is formed on the first substrate 100 to cover the gate conductor and the pixel electrode 191.

Referring to FIG. 8, a semiconductor layer 131 and a data conductor including a source electrode 173 and a drain electrode 174 is formed on the first insulating layer 110. The data conductor and the semiconductor layer 131 may be formed using a single mask by a photolithography process. However, the data conductor and the semiconductor layer 131 may be formed using different masks. In this case, the semiconductor layer 131 may be formed using a first mask by the first photolithography process and the data conductor may be formed using a second mask different from the first mask by the second photolithography process.

The source electrode 173 and the drain electrode 174 may overlap the semiconductor layer 131, and the extension 175 of the drain electrode 174 may partially overlap the metal layer 125 and the protrusion 192 of the pixel electrode 191. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta).

Figure 9:
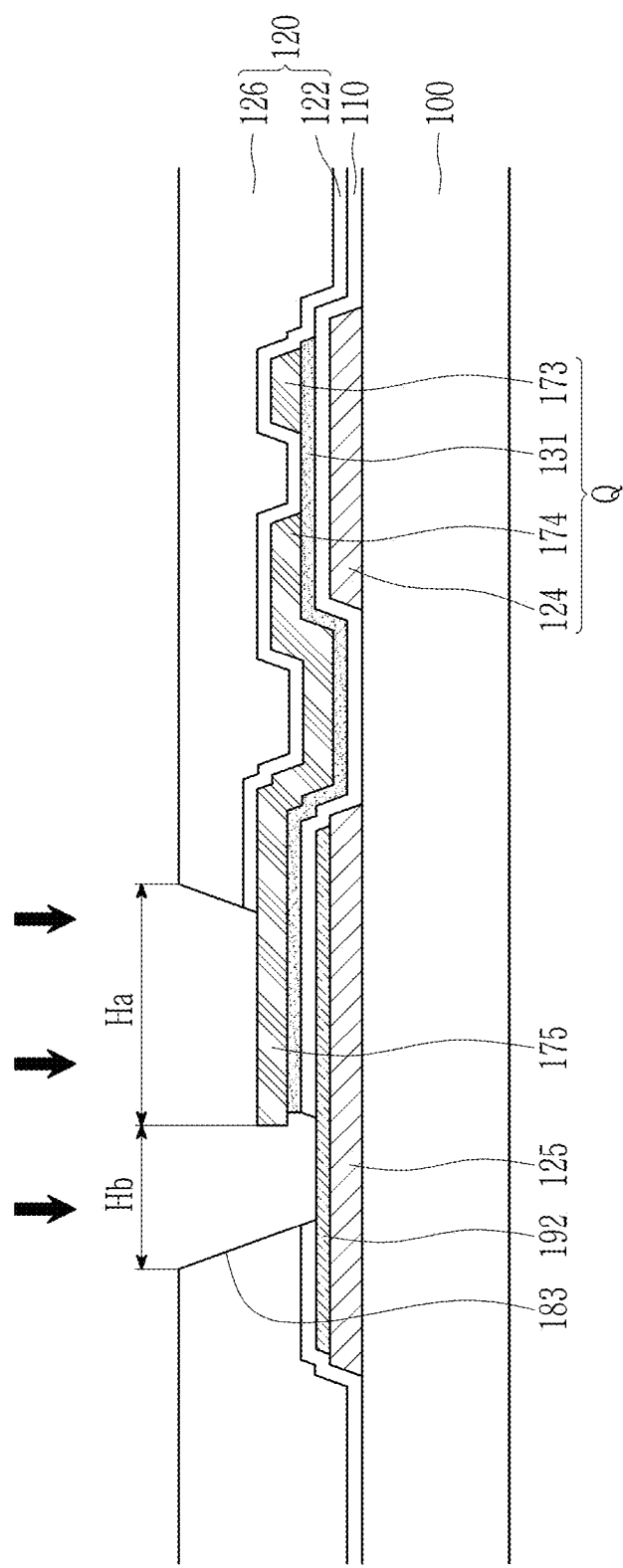

Thereafter, a second insulating layer 120 is formed to cover the data conductor and the first insulating layer 110 as disclosed in FIG. 9.

Referring to FIG. 9, an opening 183 is formed by removing the first insulating layer 110 and the second insulating layer 120. Herein, the opening 183 indicates a first opening.

The opening 183 is formed by a dry etch process. The dry etch process may be performed in a vacuum chamber, and an etching gas such as chlorine (Cl$_2$), oxygen (O$_2$), nitrogen (N$_2$), sulfur hexafluoride (SF$_6$), nitrogen trifluoride (NF$_3$), or argon (Ar) may be used.

The second insulating layer 120 may be etched first, and the first insulating layer 110 may be etched later to form the opening 183. When the second insulating layer 120 is first etched, an upper surface of the extension 175 may be exposed in the first region Ha. Subsequently, as the first insulating layer 110 is etched, the upper surface of the protrusion 192 may be exposed in the second region Hb. As the first insulating layer 110 and the second insulating layer 120 are sequentially etched, etched surface boundaries between the respective insulating layers may not coincide with each other.

On the other hand, when an etching rate of the first insulating layer 110 and the second insulating layer 120 are the same, the etched surface boundaries between the insulating layers may be formed to coincide with each other. In an exemplary embodiment, the etched surface boundaries between the first insulating layer 110 and the second insulating layer 120 formed at a left side of the second region Hb of the opening 183 may be coincident with each other.

In this case, when either one layer is etched more, an undercut or a protrusion may be formed on the etched surface. In an exemplary embodiment, the semiconductor layer 131 and the first insulating layer 110 disposed under the extension 175 of the drain electrode 174 may be undercut at a right side of the first region Ha of the opening 183. That is, a boundary between side surfaces of the semiconductor layer 131 and the first insulating layer 110 positioned at a lower portion of the extension 175 of the drain electrode 174 may be recessed from a boundary of a side surface of the extension 175 of the drain electrode 174. Accordingly, the pixel electrode connector 271 may be disposed at a part of the undercut portion of the first insulating layer 110, but may not be disposed at a side surface of the extension 175. A side surface of the opening 183 in the semiconductor layer 131 and the first insulating layer 110 may be formed to be inclined toward the second region Hb and may be vertical to the surface of the first substrate 100 depending on a method of forming the opening 183. Herein, according to an exemplary embodiment, the semiconductor layer 131 may be simultaneously etched with the first insulating layer 110, or the semiconductor layer 131 may be first etched and the first insulating layer 110 may be etched later.

In the dry etch process, the upper surface of the exposed protrusion 192 of the pixel electrode 191 may be damaged by an etching gas or the like, thus conductivity may be deteriorated due to the damage on the upper surface of the exposed protrusion 192 of the pixel electrode 191. However, in an exemplary embodiment, because the metal layer 125 is disposed to completely overlap the protrusion 192 of the pixel electrode 191 in the opening 183, an extra current path may be formed in the metal layer 125. As a result, even when the upper surface of the exposed protrusion 192 of the pixel electrode 191 is damaged, the deterioration of the conductivity can be prevented. That is, even when the protrusion 192 is damaged, a current may flow through the metal layer 125 disposed below the protrusion 192, so that the current flowing through the pixel electrode 191 and the switching element may be smoothly maintained.

Figure 10:
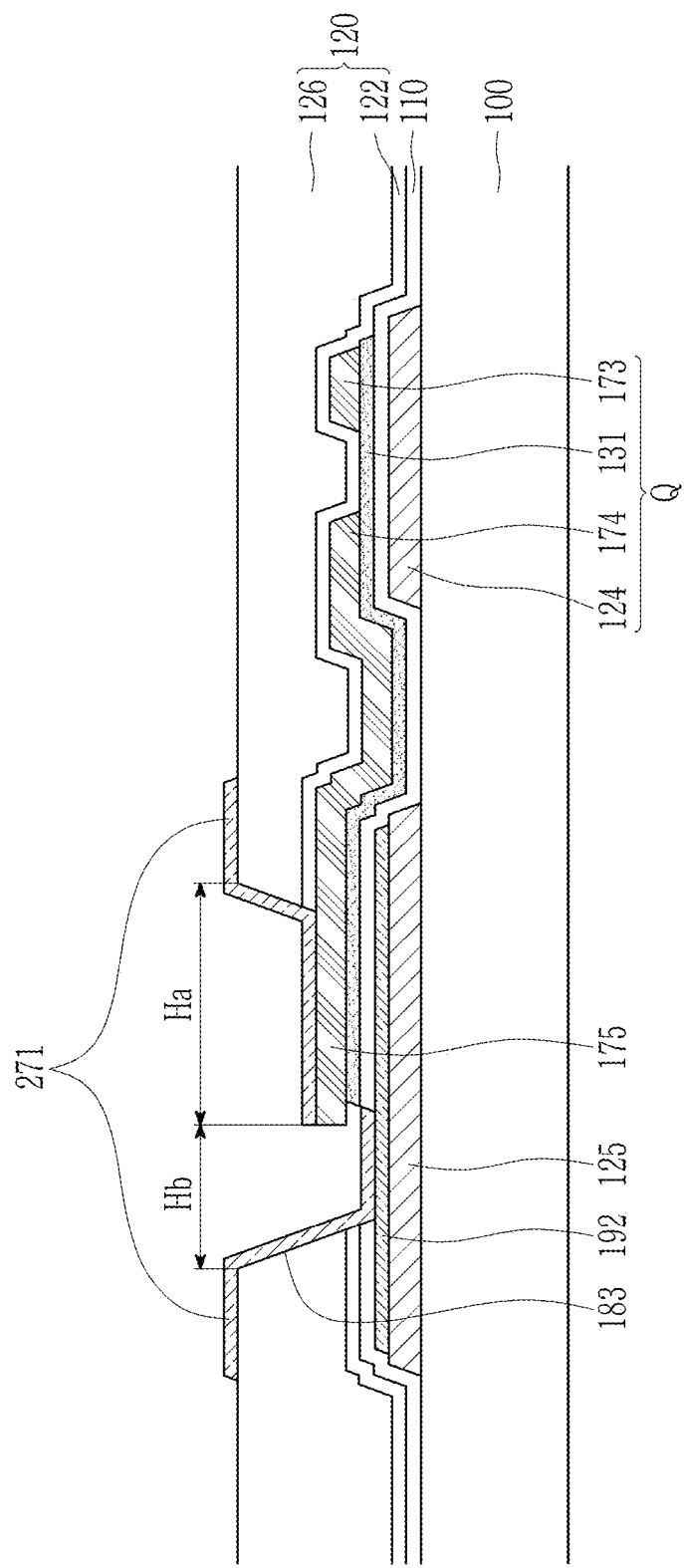

Referring to FIG. 10, the common electrode 270 which includes the pixel electrode connector 271 is formed on the second insulating layer 120. The pixel electrode connector 271 is formed to contact an upper surface of the extension 175 of the drain electrode 174 exposed in the first region Ha and an upper surface of the protrusion 192 of the pixel electrode 191 exposed in the second region Hb. The pixel electrode connector 271 and the extension 175 of the drain electrode 174 are electrically connected in the first region Ha, and the pixel electrode connector 271 and the protrusion 192 of the pixel electrode 191 are electrically connected in the second region Hb. Accordingly, the pixel electrode 191 may receive a data voltage from the drain electrode 174 of the transistor Q.

Hereinafter, an effect in which the grain growth of the pixel electrode is improved by the metal layer in the pixel electrode forming process of FIG. 7 will be described with reference to FIG. 11.

Referring to FIG. 11, a shape of a thin film that is formed on different substrates may be described.

Figure 11A:
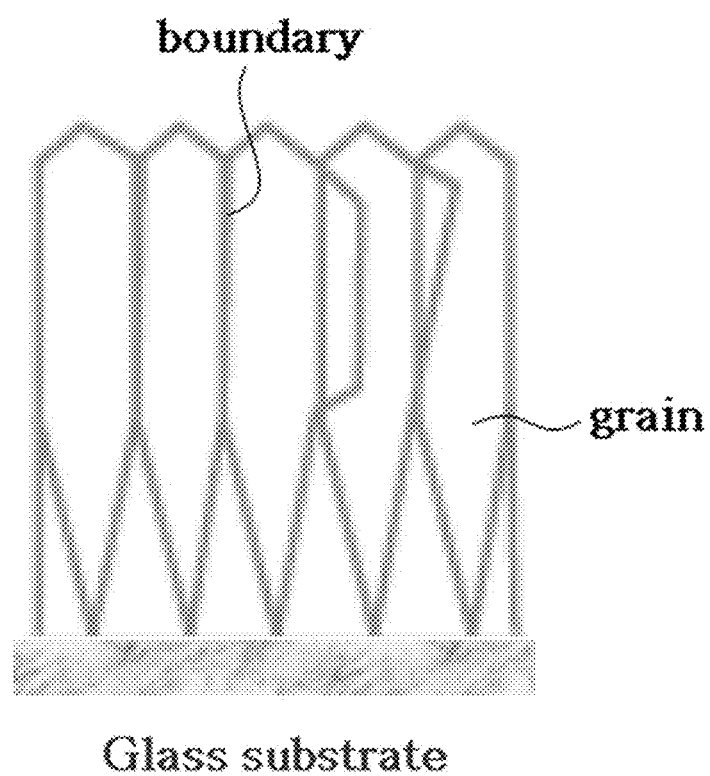
FIG. 11A illustrates a conceptual diagram showing a shape of a thin film formed on a glass substrate.
Figure 11B:
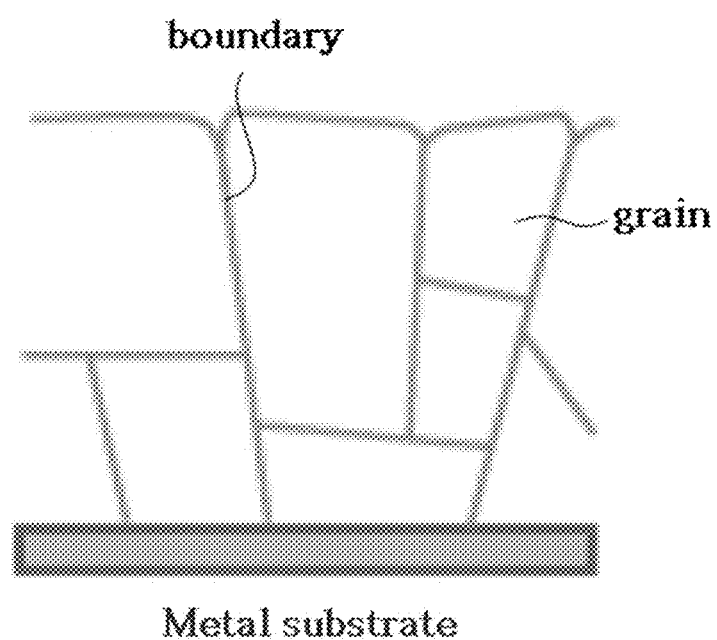
FIG. 11B illustrates a conceptual diagram showing a shape of a thin film formed on a metal substrate.

FIG. 11A illustrates a conceptual diagram showing a shape of a thin film formed on a glass substrate, and FIG. 11B illustrates a conceptual diagram showing a shape of a thin film formed on a metal substrate.

First, referring to FIG. 11A, unit grains of a thin film formed on a glass substrate are small in size and distances between adjacent boundaries are short.

On the other hand, referring to FIG. 11B, unit grains of a thin film formed on a metal substrate are larger than those of the thin film formed on the glass substrate, and distances between adjacent boundaries are long.

It can be inferred that the grain growth of the thin film is improved on the metal substrate because the size of the unit grains of the thin film formed on the metal substrate is larger than those of the thin film formed on the glass substrate. That is, when the thin film is formed on the metal substrate rather than the glass substrate, it can be seen that the grain growth of the thin film can be improved.

In an exemplary embodiment, since the protrusion 192 of the pixel electrode 191 is formed on the metal layer 125, the nucleation and grain growth may be promoted to form a thin film with improved conductivity in comparison with the case where the protrusion 192 is directly formed on the first substrate 100. Therefore, since the resistance of the protrusion 192 may be lowered by the thin film having improved grain growth, the electrical connection characteristics of the pixel electrode 191 and the transistor Q may be improved.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a substrate;
   a gate line which includes a gate electrode and a metal layer disposed on the substrate, the gate electrode and the metal layer having a same structure and a same material;
   a pixel electrode disposed on the substrate and the metal layer, and including a protrusion overlapping the metal layer;
   a first insulating layer covering the metal layer and the pixel electrode;
   an extension of a drain electrode disposed on the first insulating layer and overlapping a portion of the protrusion;
   a second insulating layer covering the first insulating layer and the extension; and a pixel electrode connector disposed on the second insulating layer and overlapping the protrusion and the extension, wherein the first insulating layer and the second insulating layer include a first opening exposing an upper surface of the protrusion and an upper surface of the extension, a width of the metal layer is larger than a width of the protrusion, and the pixel electrode connector directly contacts the upper surface of the protrusion and the upper surface of the extension through the first opening.

2. The display device of claim 1, wherein
the first opening includes a first region overlapping the protrusion and the extension, and a second region overlapping the protrusion and not overlapping the extension.

3. The display device of claim 1, wherein the first insulating layer disposed under the extension has an undercut portion.

4. The display device of claim 3, wherein
the metal layer includes a region where the first opening is defined.

5. The display device of claim 1, wherein
the pixel electrode connector includes a disconnected portion within the first opening.

6. The display device of claim 1,
wherein the metal layer is disposed at a same layer as the gate line.

7. The display device of claim 6, wherein the metal layer is not connected to the gate line.

8. The display device of claim 1, wherein
the pixel electrode connector includes a transparent conductive material.

9. The display device of claim 1, further comprising:
a common voltage line disposed on the substrate; and
a common electrode disposed on the common voltage line, wherein the first insulating layer and the second insulating layer disposed between the common voltage line and the common electrode include a second opening exposing an upper surface of the common voltage line, and the common electrode is in contact with the upper surface of the common voltage line through the second opening.

10. The display device of claim 9, wherein the pixel electrode connector is not connected to the common electrode and formed of a same material and formed at a same time as the common electrode.

11. The display device of claim 9, wherein
the pixel electrode overlaps the common electrode with the first insulating layer and the second insulating layer interposed therebetween.

12. The display device of claim 11, wherein the pixel electrode disposed in each pixel has a plate shape and the common electrode has a shape including a slit.

13. The display device of claim 12, further comprising
a liquid crystal layer disposed on the common electrode; and an upper substrate disposed on the liquid crystal layer.

14. The display device of claim 1, wherein
the second insulating layer includes a first layer including an inorganic insulating material, and a second layer disposed on the first layer and including an organic insulating material.

* * * * *